US011973311B2

(12) United States Patent
Wang (10) Patent No.: US 11,973,311 B2
(45) Date of Patent: Apr. 30, 2024

(54) TO PACKAGE FOR DFB LASER WITH TEC VERTICALLY MOUNTED IN GROOVE OF HEATSINK

(71) Applicant: HISENSE BROADBAND MULTIMEDIA TECHNOLOGIES CO., LTD., Shandong (CN)

(72) Inventor: Guoguo Wang, Shandong (CN)

(73) Assignee: HISENSE BROADBAND MULTIMEDIA TECHNOLOGIES CO., LTD., Shandong (CN)

( * ) Notice: Subject to any disclaimer, the term of this patent is extended or adjusted under 35 U.S.C. 154(b) by 853 days.

(21) Appl. No.: 16/879,985

(22) Filed: May 21, 2020

(65) Prior Publication Data

US 2020/0287347 A1    Sep. 10, 2020

Related U.S. Application Data

(63) Continuation-in-part of application No. PCT/CN2019/075259, filed on Feb. 15, 2019.

(30) Foreign Application Priority Data

Feb. 22, 2018 (CN) .......................... 201810153984.5

(51) Int. Cl.
*H01S 5/02315* (2021.01)
*H01S 5/02212* (2021.01)
(Continued)

(52) U.S. Cl.
CPC .......... *H01S 5/02315* (2021.01); *H01S 5/023* (2021.01); *H01S 5/0231* (2021.01);
(Continued)

(58) Field of Classification Search
CPC .... H01S 5/02315; H01S 5/023; H01S 5/0231; H01S 5/0233; H01S 5/0235; H01S 5/02415; H01S 5/02476; H01S 5/02212
See application file for complete search history.

(56) References Cited

U.S. PATENT DOCUMENTS 5,005,178 A * 4/1991 Kluitmans ........... G02B 6/4202
372/38.1
6,703,561 B1 * 3/2004 Rosenberg .......... H01S 5/02212
174/541
(Continued)

FOREIGN PATENT DOCUMENTS

CN          1643751 A       7/2005
CN        101924323 A      12/2010
(Continued)

OTHER PUBLICATIONS

International Search Report and Written Opinion of corresponding International Application No. PCT/CN2019/075259 dated May 9, 2019, with English translation.
(Continued)

*Primary Examiner* — M. A. Golub-Miller
(74) *Attorney, Agent, or Firm* — Morgan, Lewis & Bockius LLP (57) ABSTRACT

An optical sub-module includes a base body having a first base surface and a second base surface that are opposite to each other, a plurality of pins each penetrating through the second base surface and the first base surface, a heat sink disposed on the first base surface and having a groove facing the plurality of pins, a temperature regulator disposed in the groove, and a light emitter disposed on the temperature regulator. The temperature regulator includes a first heat exchange surface and a second heat exchange surface that are opposite to each other, the first heat exchange surface is in contact with an inner wall of the groove, and the light
(Continued)

emitter is disposed at the second heat exchange surface so as to perform heat transfer with the temperature regulator.

18 Claims, 7 Drawing Sheets

(51) Int. Cl.
| | |
|---|---|
| H01S 5/023 | (2021.01) |
| H01S 5/0231 | (2021.01) |
| H01S 5/0233 | (2021.01) |
| H01S 5/02345 | (2021.01) |
| H01S 5/0235 | (2021.01) |
| H01S 5/024 | (2006.01) |
| H01S 5/062 | (2006.01) |
| H01S 5/12 | (2021.01) |

(52) U.S. Cl.
CPC .......... *H01S 5/0233* (2021.01); *H01S 5/0235* (2021.01); *H01S 5/02415* (2013.01); *H01S 5/02476* (2013.01); *H01S 5/02212* (2013.01); *H01S 5/02345* (2021.01); *H01S 5/06226* (2013.01); *H01S 5/12* (2013.01)

(56) References Cited

U.S. PATENT DOCUMENTS

| | | | |
|---|---|---|---|
| 8,699,533 B1* | 4/2014 | Wach | H01S 5/02212 372/34 |
| 11,777,189 B2* | 10/2023 | Drögemüller | H01S 5/02345 343/702 |
| 2003/0108073 A1* | 6/2003 | Nishiyama | H01S 5/0231 372/36 |
| 2003/0235223 A1* | 12/2003 | Koizumi | H01S 5/023 372/36 |
| 2004/0081410 A1* | 4/2004 | Aronson | H01S 5/02212 257/E23.19 |
| 2004/0129441 A1* | 7/2004 | Giaretta | H01S 5/02375 174/548 |
| 2004/0163836 A1* | 8/2004 | Kumar | H01S 5/02375 257/E23.19 |
| 2004/0168819 A1* | 9/2004 | Rosenberg | H01S 5/02212 257/E23.19 |
| 2004/0240497 A1* | 12/2004 | Oomori | H01S 5/02212 372/36 |
| 2004/0240502 A1* | 12/2004 | Yamamoto | G11B 7/123 |
| 2004/0240800 A1* | 12/2004 | Uchida | G02B 6/4201 385/92 |
| 2004/0247004 A1* | 12/2004 | Keh | H01S 5/0231 372/36 |
| 2005/0089070 A1 | 4/2005 | Honda | |
| 2006/0146899 A1* | 7/2006 | Song | H01L 24/97 372/38.1 |
| 2006/0176918 A1* | 8/2006 | Aruga | H01S 5/02345 372/38.1 |
| 2007/0120134 A1* | 5/2007 | Oshima | H01S 5/02345 257/82 |
| 2007/0228535 A1* | 10/2007 | Fujino | H01S 5/0231 257/678 |
| 2008/0276624 A1 | 11/2008 | Morimoto | |
| 2009/0103581 A1* | 4/2009 | Bessho | H01S 5/02469 372/36 |
| 2010/0309661 A1 | 12/2010 | Okura | |
| 2011/0122905 A1* | 5/2011 | Bean | H01S 5/0225 372/38.03 |
| 2014/0328361 A1* | 11/2014 | Matsusue | H01S 5/02469 372/36 |
| 2015/0180199 A1* | 6/2015 | Shibata | H01S 5/0687 372/34 |
| 2016/0352069 A1* | 12/2016 | Kimura | H01S 5/02212 |
| 2017/0093123 A1* | 3/2017 | Takizawa | H01S 5/0233 |
| 2018/0069373 A1* | 3/2018 | Maki | H03L 7/26 |
| 2019/0074658 A1* | 3/2019 | Jungwirth | H01S 5/02325 |
| 2019/0319424 A1* | 10/2019 | Kihara | G02B 19/0014 |
| 2020/0203922 A1* | 6/2020 | Zhang | H01S 5/02212 |
| 2020/0220322 A1* | 7/2020 | Takagi | H01L 23/66 |
| 2022/0069543 A1* | 3/2022 | Wai Li | H01S 5/02212 |
| 2022/0238980 A1* | 7/2022 | Drögemüller | H01Q 1/1221 |
| 2022/0302671 A1* | 9/2022 | Noguchi | H01S 5/0232 |

FOREIGN PATENT DOCUMENTS

| | | |
|---|---|---|
| CN | 201887327 U | 6/2011 |
| CN | 203119289 U | 8/2013 |
| CN | 203660271 U | 6/2014 |
| CN | 107482470 A | 12/2017 |
| CN | 107508141 A | 12/2017 |
| CN | 108390255 A | 8/2018 |
| EP | 1 291 987 A2 | 3/2003 |
| HK | 1054126 A1 | 2/2010 |
| JP | 2010-16323 A | 1/2010 |
| JP | 2010-34137 A | 2/2010 |

OTHER PUBLICATIONS

First Office Action issued in corresponding Chinese Patent Application No. 201810153984.5 dated Sep. 4, 2019, with English translation.

Second Office Action issued in corresponding Chinese Patent Application No. 201810153984.5 dated Apr. 21, 2020, with English translation.

* cited by examiner

TO PACKAGE FOR DFB LASER WITH TEC VERTICALLY MOUNTED IN GROOVE OF HEATSINK

CROSS-REFERENCE TO RELATED APPLICATIONS

This application is a continuation in part of PCT/CN2019/075259 filed on Feb. 15, 2019, which claims priority to Chinese Patent Application No. 201810153984.5 filed with the Chinese Patent Office on Feb. 22, 2018, titled "OPTICAL SUB-MODULE AND OPTICAL MODULE", which are incorporated herein by reference in their entireties.

TECHNICAL FIELD

The present disclosure relates to the field of optical communication, and in particular, to an optical sub-module and an optical module.

BACKGROUND

An optical module is a device used for conversion between optical signals and electrical signals in optical communication.

The optical module usually includes at least one optical sub-module, and the at least one optical sub-module includes at least one of a transmitter optical sub-module, a receiver optical sub-module, or a bi-directional optical sub-module.

Here, the transmitter optical sub-module may also be commonly referred to as a transmitter optical sub-assembly (TOSA), which is configured to convert an electrical signal into an optical signal. The receiver optical sub-module may also be commonly referred to as a receiver optical sub-assembly (ROSA), which is configured to convert an optical signal into an electrical signal. The bi-directional optical sub-module may also be commonly referred to as a bi-directional optical sub-assembly (BOSA), which is configured to convert an electrical signal into an optical signal and convert an optical signal into an electrical signal.

SUMMARY

In one aspect, embodiments of the present application provide an optical sub-module. The optical sub-module includes a base body having a first base surface and a second base surface that are opposite to each other, a plurality of pins each penetrating through the second base surface and the first base surface, a heat sink disposed on the first base surface and including a groove facing the plurality of pins, a temperature regulator disposed in the groove, and a light emitter disposed on the temperature regulator. The temperature regulator includes a first heat exchange surface and a second heat exchange surface that are opposite to each other, the first heat exchange surface is in contact with an inner wall of the groove, and the light emitter is disposed at the second heat exchange surface and configured to perform heat transfer with the temperature regulator.

In another aspect, the embodiments of the present application further provide an optical module. The optical module includes a circuit board and at least one optical sub-module described above disposed on the circuit board.

BRIEF DESCRIPTION OF THE DRAWINGS

In order to explain the technical solutions in the embodiments of the present application more clearly, the accompanying drawings used in the description of the embodiments will be introduced briefly. The accompanying drawings to be described below show some illustrative embodiments of the application, and a person of ordinary skill in the art may obtain other drawings according to those drawings without paying any creative effort.

DETAILED DESCRIPTION

The technical solutions in some embodiments of the present disclosure will be clearly and completely described below in combination with the accompanying drawings. However, the described embodiments are merely some but not all embodiments of the present disclosure. All other embodiments obtained by a person of ordinary skill in the art on the basis of the embodiments of the present disclosure shall be included in the protected scope of the present disclosure.

Unless the context otherwise requires, in the entire specification and the claims, the term "comprise" and other forms such as the third-person singular form "comprises" and the present participle form "comprising" are construed as open and inclusive, i.e., "including but not limited to". In the description of the specification, terms "one embodiment", "some embodiments", "exemplary embodiments", "example", "specific example", or "some examples" are intended to indicate that specific features, structures, materials, or characteristics related to the embodiment(s) or the example(s) are included in at least one embodiment or example of the present disclosure. Schematic representations of the above terms do not necessarily refer to same embodiment(s) or example(s).

In addition, the specific features, structures, materials, or characteristics may be included in any or more embodiments or examples in any suitable manner. Terms such as "first" and "second" are used for descriptive purposes only and are not to be construed as indicating or implying relative importance or implicitly indicating the number of indicated technical features below. Therefore, features defined as "first" or "second" may explicitly or implicitly include one or more of the features. In the description of the embodiments of the present disclosure, the term "plurality" means two or more unless otherwise specified.

In the description of some embodiments, the terms such as "connected", "coupled", or their extensions may be used. For example, the term "connected" may be used in the description of some embodiments to indicate that two or more components are in direct physical or electrical contact with each other. For another example, the term "coupled" may be used in the description of some embodiments to indicate that two or more components are in direct physical or electrical contact. However, the terms such as "coupled" or "communicatively coupled" may also mean that two or more components are not in direct contact with each other but still cooperate or interact with each other. For example, the terms such as "coupled" or "communicatively coupled" may also mean that two or more components are not in direct contact with each other but are in indirect contact through one or more other elements disposed therebetween. The embodiments disclosed herein are not necessarily limited to the contents herein.

To make the purpose, the technical solutions, and advantages of the present disclosure clearer, the embodiments of the present disclosure will be described in further detail below in combination with the accompanying drawings.

A laser is an important optoelectronic device in an optical sub-module. For example, a distributed feedback (DFB) laser is widely used in the field of optical communication because it has a good monochromaticity (i.e., a high spectral purity) and may be used to transmit data signals.

The development and maturing of international telecommunication standard 5th generation wireless systems (5G) is driving a large increase in data flow rates in data centers, and transmission rates of lasers in such data centers are continuously increased to support the higher data flow rates. In the related art, a transmission rate of the DFB laser may reach, for example, 25 Gbit/s, 40 Gbit/s, or even 100 Gbit/s. A DFB laser with a transmission rate of 25 Gbit/s has become an important component of equipment used to achieve the international telecommunication standard 5G and the data center.

According to different operating temperatures, the DFB lasers may generally be divided into the following three types: a commercial-grade DFB laser, an industrial-grade DFB laser, and an extended-grade DFB laser.

Taking DFB lasers of different types and with transmission rates of 25 Gbit/s as an example, an operating temperature of the commercial-grade DFB laser is within a range from −5° C. to 75° C., inclusive, an operating temperature of the industrial-grade DFB laser is within a range from −40° C. to 85° C., inclusive (or even within a range from −40° C. to 95° C., inclusive), and an operating temperature of the extended-grade DFB laser is within a range from −5° C. to 85° C., inclusive (or even within a range from −5° C. to 95° C., inclusive).

A manufacturing process of the commercial-grade DFB laser is very simple. Therefore, there are a large number of commercial-grade DFB lasers in the market. An industrial-grade high-speed (referring to a transmission rate of 25 Gbit/s and above) DFB laser is very difficult to manufacture and has a low yield. Therefore, a price of the industrial-grade high-speed DFB laser is very high, and is usually 1.5-2 times a price of the commercial-grade DFB laser.

In a scenario in which a range of an operating temperature corresponds to the range of the operating temperature of the industrial-grade DFB laser, the industrial-grade DFB laser with a transmission rate of 25 Gbit/s needs to be used. Alternatively, either of the following two solutions can be used:

1) the industrial-grade DFB laser could be used without a cooler packaged therewith, but technology for manufacturing this kind of DFB laser is immature, and a price thereof is high, which make mass production and mass use of such lasers difficult to achieve; and 2) the commercial-grade DFB laser or the extended-grade DFB laser could be used, and the temperature of the commercial-grade DFB laser or the extended-grade DFB laser may be controlled to remain within the operating temperature range of the commercial-grade DFB laser by using a cooler such as a thermoelectric cooler (TEC).

Although the commercial-grade DFB laser or the extended-grade DFB laser, which has low price than the industrial-grade DFB, is used in the second solution, an application scope of the second solution is limited due to the need for a complex packaging process and a resultantly high packaging cost of the optical sub-module including the TEC.

In addition, transistor-outline (TO) packaging technology presents advantages of miniaturization, low cost, simple packaging process, and easy industrial mass production.

Therefore, in a case where the above second solution is adopted, the TO packaging technology may be used to package the cooler and the DFB laser.

Figure 1:
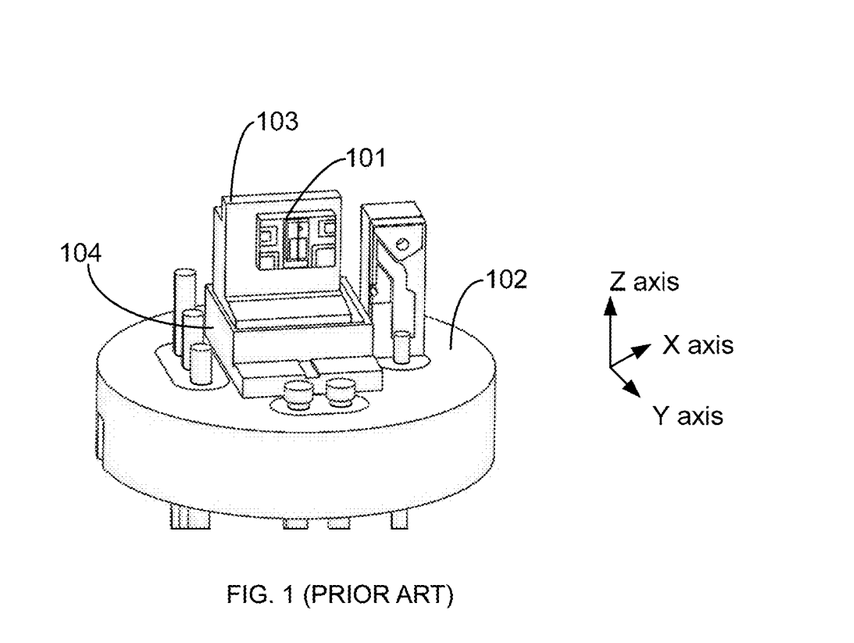
FIG. 1 is a schematic diagram showing a structure after a distributed feedback (DFB) laser and a cooler are packaged by using transistor-outline (TO) packaging technology.

Specifically, FIG. 1 is a schematic diagram showing a structure after the DFB laser and the cooler are packaged by using the TO packaging technology. The cooler 104 is disposed on a coaxial base 102, a heat sink 103 is disposed on the cooler 104, and the DFB laser 101 is disposed on a side wall of the heat sink 103.

Heat generated by the DFB laser 101 can only be transferred to the cooler 104 through the heat sink 103. Therefore, a heat dissipation effect of the DFB laser 101 is not good, and further the operating temperature of the DFB laser is difficult to be controlled within the operating temperature range required by the commercial-grade DFB laser.

In contrast to the TO packaged embodiment of FIG. 1, embodiments of the present disclosure described in relation to FIGS. 2-11 provide an optical sub-module including a base body, a plurality of pins, a heat sink, a temperature regulator, and a light emitter.

The base body includes a first base surface and a second base surface that are opposite to each other. A plurality of pins penetrate the second base surface and the first base surface from the second base surface to the first base surface. The heat sink is disposed on the first base surface and includes a groove facing the plurality of pins. The temperature regulator is disposed in the groove, the temperature regulator includes a first heat exchange surface and a second heat exchange surface that are opposite to each other, and the first heat exchange surface is in contact with an inner wall of the groove. The light emitter is disposed at the second heat exchange surface and is configured to perform heat transfer with the temperature regulator.

Figure 4:
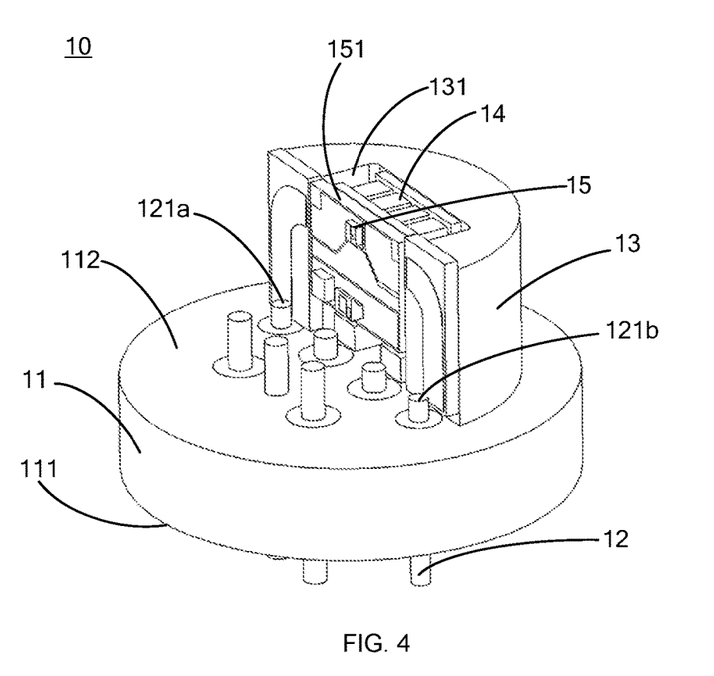
FIG. 4 is a schematic diagram showing an internal structure of an optical sub-module, in accordance with some embodiments of the present disclosure.

FIG. 4 is a schematic diagram showing an overall structure of an optical sub-module, in accordance with some embodiments of the present disclosure. As shown in FIG. 4, the optical sub-module 10 includes the base body 11, the plurality of pins 12, the heat sink 13, the temperature regulator 14, and the light emitter 15.

As shown in FIG. 4, the base body 11 includes the first base surface 112 and the second base surface 111 that are opposite to each other. For convenience of description, the first base surface 112 is referred to as a top face 112, and the second base surface 111 is referred to as a bottom face 111 hereinafter. The base body 11 may have various shapes. For example, the base body 11 may have a cylindrical shape or a prismatic shape.

As shown in FIG. 4, each of the plurality of pins 12 extends through the base body 11 to penetrate both the bottom face 111 and the top face 112. As such, there are a plurality of pin holes in one-to-one correspondence with the plurality of pins 12 in the base body 11, and two opposite openings of each pin hole are respectively disposed in the bottom face 111 and the top face 112. As a result, each pin 12 inserted into a corresponding pin hole penetrates the bottom face 111 and the top face 112 of the base body 11 from the bottom face 111 to the top face 112.

Furthermore, the plurality of pins 12 may be fixed on the base body 11 in a plurality of ways. For example, after each pin 12 passes through the corresponding pin hole, the pin 12 is fixed on at least one of the bottom face 111 or the top face 112 of the base body 11 through soldering.

Here, in order to facilitate an electrical connection between the plurality of pins 12 and the light emitter 15, the plurality of pins 12 are disposed at a same side of the heat sink 13.

As shown in FIG. 4, the heat sink 13 is disposed on the top face 112, and the heat sink 13 includes the groove 131 facing the plurality of pins 12. For example, the heat sink 13 may be made of an alloy, such as a nickel-based alloy (or an iron-based alloy), or a copper alloy.

In some embodiments of the present disclosure, the heat sink 13 and the base body 11 may be an integrated structure.

In some other embodiments of the present disclosure, the heat sink 13 and the base body 11 are separate structures, and the heat sink 13 is mounted on the top face 112 of the base body 11.

In some embodiments of the present disclosure, as shown in FIGS. 4 and 6-8, the groove 131 may be disposed so as to extend in a direction perpendicular to the top face 112.

Figure 6:
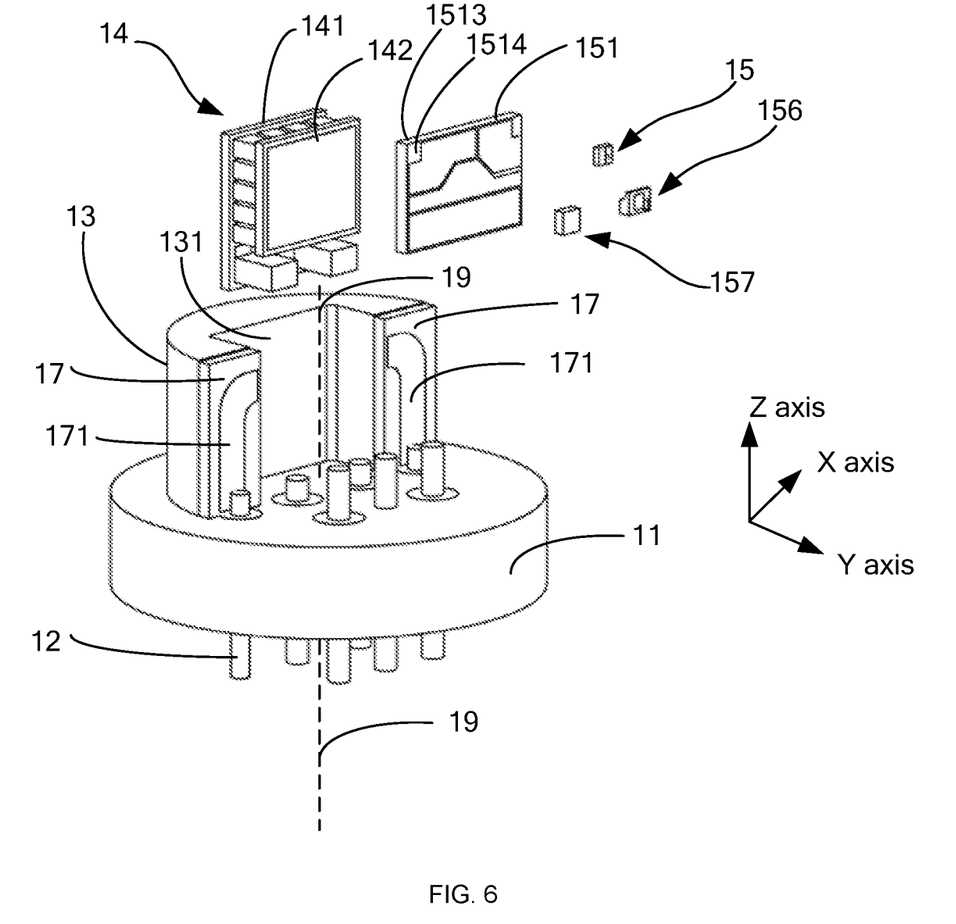
FIG. 6 is a schematic exploded diagram of an internal structure of the optical sub-module shown in FIG. 4.

As shown in FIGS. 4 and 6, the temperature regulator 14 is disposed in the groove 131. The temperature regulator 14 includes the first heat exchange surface 141 and the second heat exchange surface 142. The first heat exchange surface 141 is in contact with one or more inner wall(s) of the groove 131 of the heat sink 13 to absorb heat of the temperature regulator 14, thereby dissipating the heat of the temperature regulator 14.

Here, the first heat exchange surface 141 may contact the groove 131 of the heat sink 13 in a plurality of ways. For example, the first heat exchange surface 141 can be in partial contact with or can be fully attached to a bottom wall of the groove 131 located at a bottom of the groove. For another example, the first heat exchange surface 141 can be in partial contact with or can be fully attached to both side walls of the groove 131 disposed on opposite sides of the bottom wall. For yet another example, the first heat exchange surface 141 can be in partial contact with or can be fully attached to the bottom wall of the groove 131, and can further be in partial contact with or fully attached to both side walls of the groove 131. The embodiments of the present disclosure are not limited to the particular embodiments described herein, and can more generally have structures that provide for the heat of the temperature regulator 14 to be dissipated by contacting the groove 131 of the heat sink 13.

The groove 131 penetrates (or extends to) a lower surface of the heat sink 13 and an upper surface of the heat sink 13, and extends from the lower surface of the heat sink 13 to the upper surface of the heat sink 13. A depth of the groove 131 is matched with a thickness of the temperature regulator 14 to ensure that an entirety of the temperature regulator 14 is embedded into the groove 131. For example, as shown in FIG. 6, the term "depth of the groove" refers to a dimension of the groove 131 along the Y-axis direction, and a thickness of the temperature regulator 14 refers to a dimension of the temperature regulator 14 along the Y-axis direction. For convenience of description, a direction pointing from the bottom face 111 to the top face 112 is an upward direction (or Z direction, in FIG. 6). That is, word "upper" in the term "upper surface" takes this direction as reference. Conversely, a direction pointing from the top face 112 to the bottom face 111 is a downward direction (or −Z direction, in FIG. 6). That is, word "lower" in the term "lower surface" takes this direction as reference.

As shown in FIG. 4, the light emitter 15 is disposed at the second heat exchange surface 142 and is configured to perform heat transfer with the temperature regulator 14.

In some embodiments of the present disclosure, as shown in FIG. 4, the optical sub-module 10 further includes a substrate 151 disposed on the second heat exchange surface 142, and the light emitter 15 is disposed on the substrate 151. For example, the light emitter 15 is disposed on a surface of the substrate 151 that faces away from the second heat exchange surface 142.

In some other embodiments of the present disclosure, the light emitter 15 is disposed on the second heat exchange surface 142 of the temperature regulator 14. That is, in such other embodiments, the light emitter 15 is directly attached to the second heat exchange surface 142.

In some embodiments of the present disclosure, the light emitter 15 includes a DFB laser.

Figure 5:
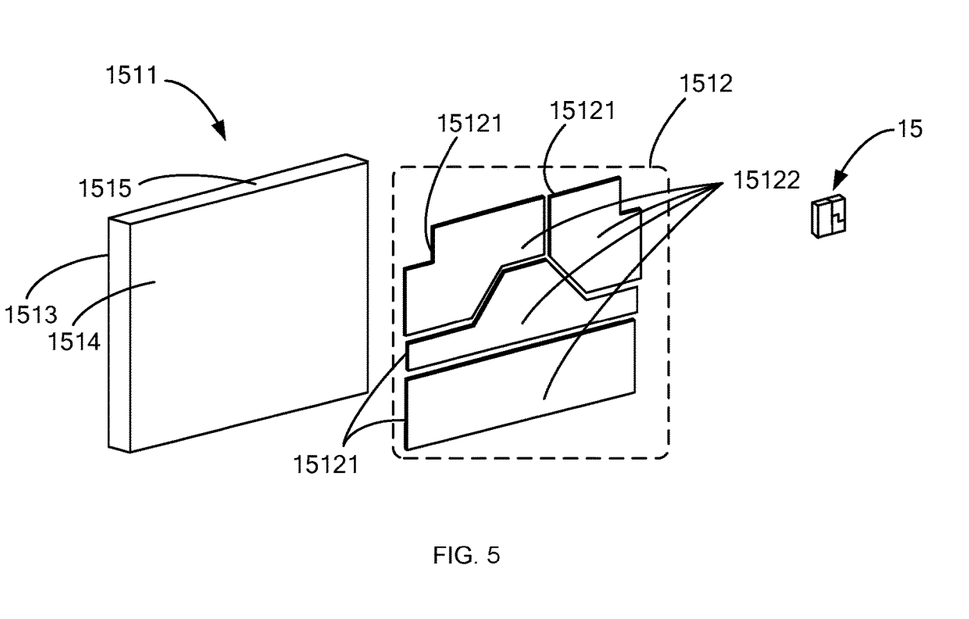
FIG. 5 is a schematic exploded diagram of partial structures in the optical sub-module shown in FIG. 4.

In some embodiments of the present disclosure, as shown in FIG. 5, the substrate 151 includes a substrate body 1511 and a conductive layer 1512 disposed on the substrate body 1511. The substrate body 1511 includes a first body surface 1513 and a second body surface 1514 that are opposite to each other. The conductive layer 1512 includes a first conductive layer surface 15121 and a second conductive layer surface 15122 that are opposite to each other. The first conductive layer surface 15121 is in contact with the second body surface 1514, and the second conductive layer surface 15122 is in contact with the light emitter 15. The substrate body 1511 is made of a material having thermal conductivity and insulativity, such as ceramic or plastic. The conductive layer 1512 may be, a metal layer, and is made of, for example, gold.

As shown in FIG. 6, the second heat exchange surface 142 is configured to be in contact with the first body surface 1513. The second body surface 1514 is more proximate to a central axis 19 of the base body 11 than the first body surface 1513. The central axis 19 penetrates the top face 112 and the bottom face 111. In this way, the above structures on the top surface 112 may be distributed uniformly.

It will be seen that, in the embodiments of the present disclosure depicted in the figures, the first heat exchange surface 141 of the temperature regulator 14 is in direct contact with the heat sink 13. In this case, on one hand, the heat generated by the temperature regulator 14 is quickly dissipated through the heat sink 13. On another hand, the light emitter 15 is disposed at the second heat exchange surface 142 of the temperature regulator 14. For example, the light emitter 15 can be disposed on the second heat exchange surface 142 of the temperature regulator 14, or the light emitter 15 can be disposed on the substrate 151 on the second heat exchange surface 142 of the temperature regulator 14, thereby ensuring an efficient heat transfer between the light emitter 15 and the temperature regulator 14, and improving a heat transfer efficiency between the light emitter 15 and the temperature regulator 14. Furthermore, the heat received or generated by the temperature regulator 14 may be directly dissipated through the heat sink 13, which further improves a heat dissipation rate of the light emitter 15.

Through the above setting manner, an operating temperature of the light emitter 15 may be effectively controlled within the operating temperature range required by the commercial-grade DFB laser (for example, from −5° C. to 75° C., inclusive), which meets the heat dissipation requirement for the DFB laser in the second solution.

Figure 7:
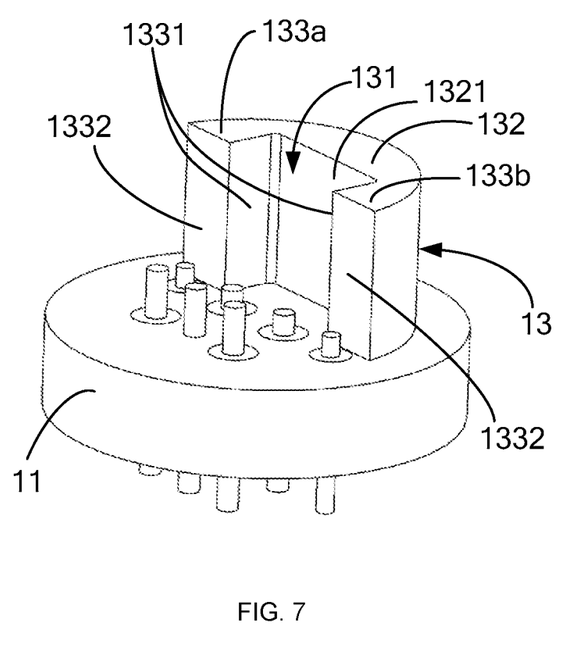
FIG. 7 is a schematic diagram showing an overall structure in which a heat sink is mounted on a base body in an optical sub-module, in accordance with some embodiments of the present disclosure.
Figure 8:
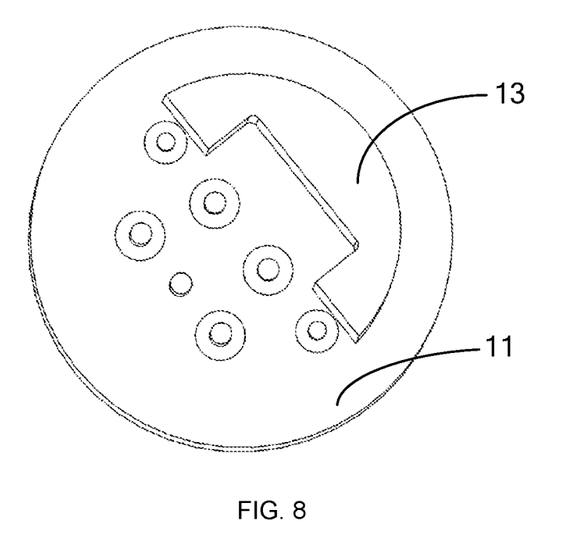
FIG. 8 is a top view of the heat sink and the base body in the optical sub-module shown in FIG. 7.

FIG. 7 is a schematic diagram showing an overall structure in which the heat sink 13 is mounted on the base body 11 in some embodiments of the present disclosure. FIG. 8 is a top view of the heat sink 13 and the base body 11 shown in FIG. 7. As shown in FIGS. 7 and 8, the heat sink 13 includes a heat sink body 132 and two side arms (i.e., a first side arm 133a and a second side arm 133b) extending from a same side of the heat sink body 132 and disposed on opposite sides of the groove 131. As shown in FIG. 8, the heat sink body 132 and the two side arms 133a and 133b form the groove 131 together, so that the heat sink 13 is a U-shaped structure as a whole. An opening (i.e., the groove 131) of the U-shaped structure faces the plurality of pins 12.

Here, the heat sink body 132 and the two side arms form the groove 131 together. That is, an inner side wall 1331 of each side arm 133a and 133b is a side wall of the groove 131, and an inner side wall 1321 of the heat sink body 132 is the bottom wall of the groove 131.

It will be seen from the foregoing description that the heat sink 13 is configured to dissipate the heat of the temperature regulator 14, and because the temperature regulator 14 is disposed in the groove 131 of the heat sink 13, the heat sink 13 is further configured to accommodate the temperature regulator 14.

In some embodiments of the present disclosure, as shown in FIG. 6, the optical sub-module 10 further includes an insulating plate 17 disposed on an end face 1332 of each side arm 133a and 133b, and a conductive trace 171 disposed on a surface of the insulating plate 17 facing the plurality of pins 12. For example, the insulating plate 17 may be a plate-type structure having thermal conductivity and insulativity, such as a ceramic plate.

That is, two insulating plates 17 can be distributed on respective sides of the substrate 151. Here, the end face 1332 of each side arm refers to a surface of the side arm facing the plurality of pins 12.

Figure 10:
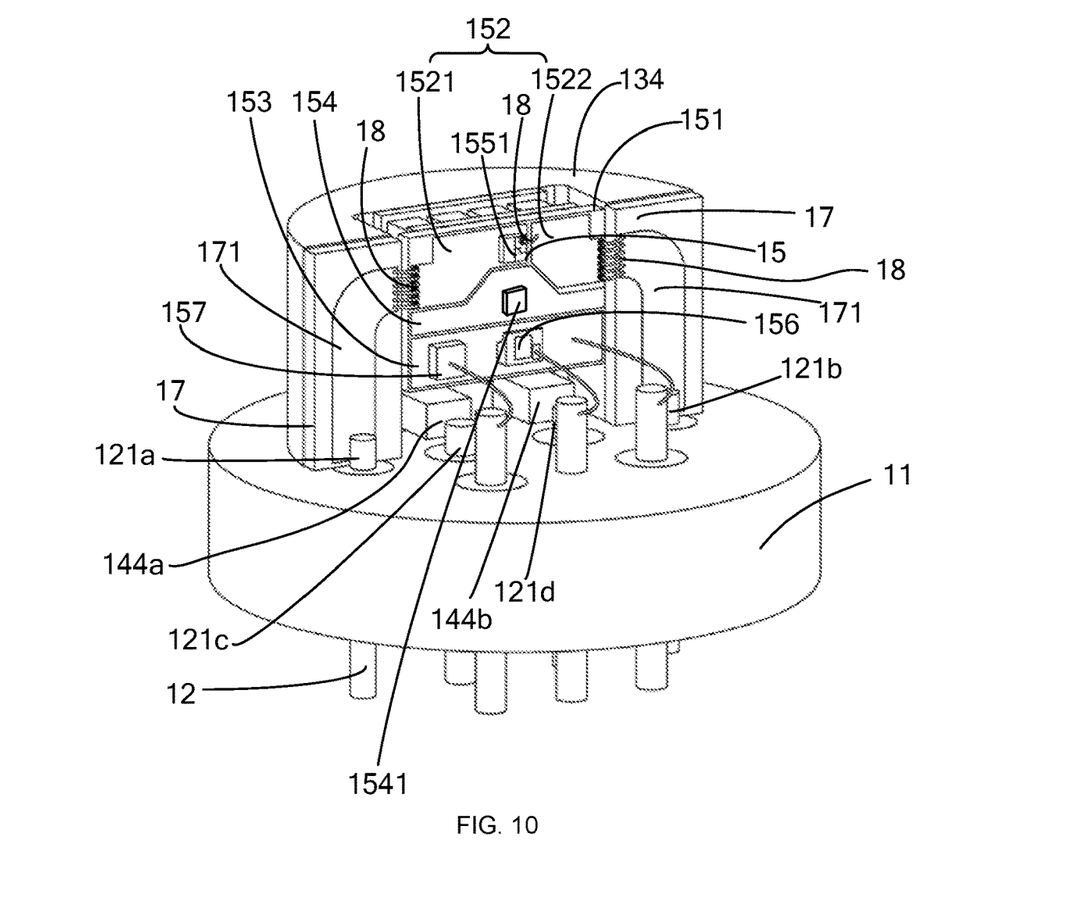
FIG. 10 is a schematic diagram showing a structure in which metal wires are connected to pins and corresponding functional devices in an optical sub-module, in accordance with some embodiments of the present disclosure.

In some embodiments of the present disclosure, as shown in FIGS. 6 and 10, the insulating plates 17 on the end faces of the two side arms are parallel or approximately parallel to each other. In this case, patterns of the conductive traces 171 on the two insulating plates 17 are mirror-symmetrical.

Figure 3:
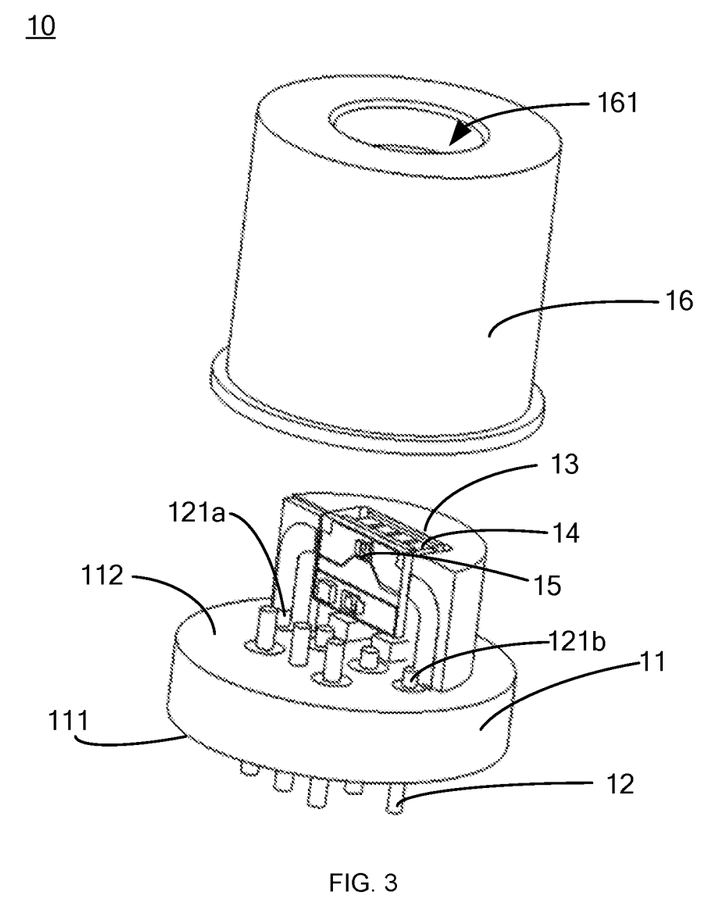
FIG. 3 is a schematic diagram showing a structure of a casing assembly in an optical sub-module and an inner structure of the optical sub-module after the casing assembly is removed, in accordance with some embodiments of the present disclosure.

In some embodiments of the present disclosure, as shown in FIGS. 3 and 4, the plurality of pins 12 include a first pin 121a and a second pin 121b that are configured to transmit high-frequency signals.

As shown in FIGS. 4, 6 and 7, in the two side arms 133a and 133b of the heat sink 131, a conductive trace 171 corresponding to an end face 1332 of the first side arm 133a is configured to be electrically connected to the first pin 121a and to the light emitter 15. For convenience of connection, the first pin 121a may be a pin of the plurality of pins 12 proximate to the conductive trace 171. A conductive trace 171 corresponding to an end face 1332 of the second side arm 133b is configured to be electrically connected to the second pin 121b and to the light emitter 15. Similarly, for convenience of connection, the second pin 121b may be a pin 12 of the plurality of pins 12 proximate to the other conductive trace 171.

That is to say, the conductive trace 171 corresponding to each side arm 133a or 133b is electrically connected to a nearby pin 121a or 121b for transmitting a high-frequency signal.

The conductive trace 171 may be a metal strip coated on the insulating plate 17, such as a micro-strip line. An impedance of the micro-strip line may be 25 ohms or 50 ohms. A surface of the micro-strip line is plated with gold. The micro-strip line may be electrically connected to metal wires by using a gold wire bonding process.

Figure 9:
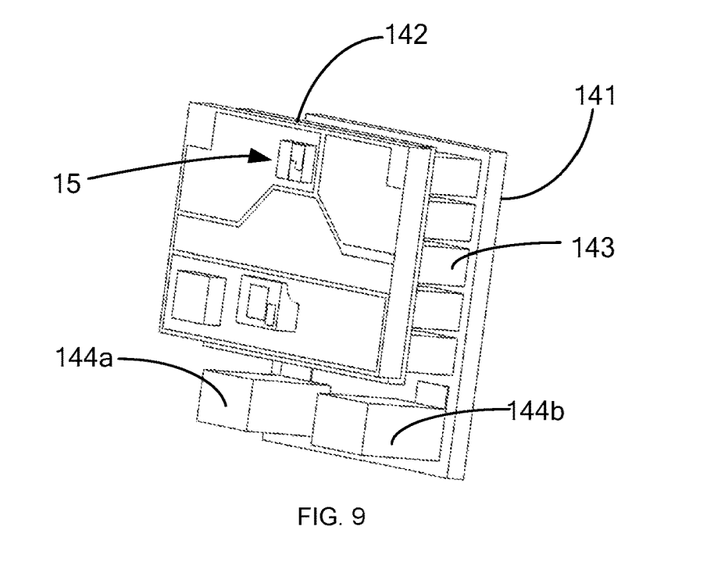
FIG. 9 is a schematic diagram showing a structure of a temperature regulator and a structure of a light emitter in an optical sub-module, in accordance with some embodiments of the present disclosure.

In some embodiments of the present disclosure, as shown in FIG. 9, the temperature regulator 14 includes the first heat exchange surface 141, the second heat exchange surface 142, and a plurality of semiconductor structures 143 spaced apart from each other between the first heat exchange surface 141 and the second heat exchange surface 142.

The plurality of semiconductor structures 143 may include at least one N-type semiconductor structure and at least one P-type semiconductor structure.

A cold end of the N-type semiconductor structure after being energized is on a same side as a cold end of the P-type semiconductor structure after being energized. Correspondingly, a hot end of the N-type semiconductor structure after being energized is on a same side as a hot end of the P-type semiconductor structure after being energized.

In some examples, the at least one N-type semiconductor structure includes a plurality of N-type semiconductor structures and the at least one P-type semiconductor structure includes a plurality of P-type semiconductor structures. The plurality of N-type semiconductor structures and the plurality of P-type semiconductor structures may be arranged in a two-dimensional array, and may be alternately arranged in both a row direction and a column direction of the array, and all the N-type semiconductor structures and all the P-type semiconductor structures may be connected in series. A connection point between an N-type semiconductor structure and a P-type semiconductor structure is proximate to one heat exchange surface of the temperature regulator 14, and the other connection point therebetween is proximate to the other heat exchange surface of the temperature regulator 14.

For example, each N-type semiconductor structure may extend between the first heat exchange surface 141 and the second heat exchange surface 142, and each P-type semiconductor structure may similarly extend between the first heat exchange surface 141 and the second heat exchange surface 142. Moreover, in situations in which the first heat exchange surface 141 is warmer relative to the second heat exchange surface 142, the end of each of the N-type and P-type semiconductor structures extended to the first heat exchange surface 141 may be referred to as a hot end and the opposite end of each of the N-type and P-type semiconductor structures extended to the second heat exchange surface 141 may be referred to as a cold end. Conversely, in situations in which the first heat exchange surface 141 is colder relative to the second heat exchange surface 142, the end of each of the N-type and P-type semiconductor structures extended to the first heat exchange surface 141 may be referred to as a cold end and the opposite end of each of the N-type and P-type semiconductor structures extended to the second heat exchange surface 141 may be referred to as a hot end. Additionally, conductive structures (e.g., conductive plates or conductive traces) may be provided on each of the first and second heat exchange surfaces 141 and 142 to electrically connect ends of N-type and P-type semiconductor structures to each other such that the N-type and P-type semiconductor structures are connected in series.

As shown in FIG. 9, in some embodiments of the present disclosure, the temperature regulator 14 further includes a first electrode 144*a* and a second electrode 144*b*. As shown in FIG. 10, the plurality of pins 12 further include a third pin 121*c* and a fourth pin 121*d* that are configured to be connected to an external power supply. The first electrode 144*a* and the second electrode 144*b* are configured to be electrically connected to the third pin 121*c* and the fourth pin 121*d*, respectively.

Here, as shown in FIG. 9, the first electrode 144*a* and the second electrode 144*b* may be prismatic electrodes. That is, one prismatic electrode 144*a* is configured to be connected to a positive electrode of the power supply, and the other prismatic electrode 144*b* is configured to be connected to a negative electrode of the power supply.

With continued reference to FIG. 10, the prismatic electrode 144*a* and the prismatic electrode 144*b* may be electrically connected to the third pin 121*c* and the fourth pin 121*d* by using the metal wires or a conductive silver adhesive. In this way, the prismatic electrode 144*a* and the prismatic electrode 144*b* are electrically connected to the power supply through the third pin 121*c* and the fourth pin 121*d*.

In a case where the prismatic electrode 144*a* and the prismatic electrode 144*b* are electrically connected to the power supply, the N-type semiconductor structures and the P-type semiconductor structures are connected to form a loop together. For example, the N-type semiconductor structures and the P-type semiconductor structures are connected in series with each other between the prismatic electrodes 144*a* and 144*b* such that a current flowing from one prismatic electrode to the other prismatic electrode flows through the series-connected N- and P-type semiconductor structures. A temperature of a connection point between an N-type semiconductor structure and a P-type semiconductor structure that are adjacent and connected, which is proximate to one heat exchange surface of the temperature regulator 14 gets high, while a temperature of the other connection point therebetween proximate to the other heat exchange surface of the temperature regulator 14 gets low, such that one of the first heat exchange surface 141 and the second heat exchange surface 142 of the temperature regulator 14 is a hot end face, and the other thereof is a cold end face.

It will be understood that, the hot end face and the cold end face are presented in the case where the prismatic electrode 144*a* and the prismatic electrode 144*b* are electrically connected to the power supply. In a case where an energization direction of the electrodes is changed, the hot end face may also be changed to a cold end face, and correspondingly the cold end face may also be changed to a hot end face.

In some embodiments of the present disclosure, the temperature regulator 14 may function as a thermoelectric cooler, i.e., a TEC cooler.

It will be understood that, in one energization direction, the first heat exchange surface 141 is the hot end face, and the second heat exchange surface 142 is the cold end face. In another energization direction, by changing the polarity of electrodes of the power supply connected to the prismatic electrode 144*a* and the prismatic electrode 144*b*, a direction of currents may be changed in the N-type semiconductor structures and the P-type semiconductor structures that are connected in series. In this way, the first heat exchange surface 141 may be changed to the cold end face, and the second heat exchange surface 142 may be changed to the hot end face.

The light emitter 15 is disposed at the second heat exchange surface 142. Therefore, in a case where the operating temperature of the light emitter 15 is greater than a maximum temperature (for example, 75° C.), the energization direction of the electrodes is changed, such that the direction of the currents in the N-type semiconductor structures and the P-type semiconductor structures that are connected in series is changed. In this way, the second heat exchange surface 142 is the cold end face, and heat of the light emitter 15 may be transferred to the second heat exchange surface 142 to lower a temperature of the light emitter 15.

Similarly, in a case where the operating temperature of the light emitter 15 is less than a minimum temperature (for example, −5° C.), the energization direction of the electrodes is changed, such that the direction of the currents in the N-type semiconductor structures and the P-type semiconductor structures that are connected in series is changed. In this way, the second heat exchange surface 142 is changed to the hot end face, and heat of the second heat exchange surface 142 may be transferred to the light emitter 15 to increase the temperature of the light emitter 15.

It will be seen that, by selectively switching the second heat exchange surface 142 of the temperature regulator 14 to be the cold end face or the hot end face, the temperature of the light emitter 15 may be maintained within the required operating temperature range in both hot and cold environments, respectively. That is to say, through a temperature regulating function of the temperature regulator 14, the light emitter 15 may be maintained within its narrow operating temperature range of which is narrow even in situations in which requirements for the temperature range are high. For example, a commercial-grade light emitter, an operating temperature of which is within a range from −5° C. to 75° C., inclusive, can be used in an industrial scenario in which an operating temperature varies within a range from −40° C. to 95° C., inclusive, through use of the temperature regulator 14. Although the operating temperature of the light emitter may vary widely in the industrial scenario, through the temperature regulating function of the temperature regulator 14, the operating temperature of the commercial-grade light emitter may still be controlled so as to be maintained within the operating temperature range of the commercial-grade light emitter and thereby meet the requirements of industrial use.

In some embodiments of the present disclosure, a distance between the cold end face and the hot end face of the temperature regulator 14 (i.e., a distance between the first heat exchange surface 141 and the second heat exchange surface 142) is approximately equal to the depth of the groove 131 of the heat sink 13 (i.e., a dimension along the Y-axis direction in FIG. 6), which enables the entire temperature regulator 14 to be embedded into the groove 131.

As shown in FIG. 5, the substrate body 1511 further includes a substrate side surface 1515 connecting and abutting both the first body surface 1513 and the second body surface 1514, and disposed to face away from the top face 112. As shown in FIGS. 5, 7, and 10, the second body surface 1514 and the surface of the insulating plate 17 on which the conductive trace 171 is disposed are in a same plane (i.e., coplanar), and the substrate side surface 1515 and a surface of the heat sink body 132 facing away from the top face 112 are in a same plane (i.e., coplanar).

As shown in FIG. 10, the optical sub-module 10 further includes a plurality of groups of metal wires 18. The conductive layer 1512 further includes a plurality of functional portions that are insulated from each other (e.g., spaced apart from each other), such as a first functional portion 152, a second functional portion 153, and a third functional portion 154 shown in FIG. 10.

Here, in some examples, there is one metal wire in a group of metal wires 18; and in some other examples, there are a plurality of metal wires spaced apart in a group of metal wires 18. The embodiments of the present disclosure do not limit the number of metal wires in each group of metal wires 18, as long as two elements connected through a group of metal wires 18 may be electrically connected. For example, the number of metal wires in each group of metal wires may be adjusted according to parameters such as sizes of elements to be connected.

In some embodiments of the present disclosure, as shown in FIG. 10, the first functional portion 152 includes a first functional sub-portion 1521 and a second functional sub-portion 1522.

The first functional sub-portion 1521 is in contact with one of a P-electrode and an N-electrode of the light emitter 15 disposed on the first functional sub-portion 1521. The first functional sub-portion 1521 is disposed adjacent to a conductive trace 171 corresponding to the end face of the first side arm 133a, and is electrically connected to the conductive trace 171 corresponding to the end face of the first side arm 133a through a corresponding one of the plurality of groups of metal wires 18. The second functional sub-portion 1522 is electrically connected to the other of the P-electrode and the N-electrode of the light emitter 15 through a corresponding one of the plurality of groups of metal wires 18. The second functional sub-portion 1522 is disposed adjacent to a conductive trace 171 corresponding to the end face of the second side arm 133b, and is electrically connected to the conductive trace 171 corresponding to the end face of the second side arm 133b through a corresponding one of the plurality of groups of metal wires 18.

For example, the first functional sub-portion 1521 and the second functional sub-portion 1522 are micro-strip lines formed through a gold plating process.

Therefore, the first pin 121a and the second pin 121b for transmitting the high-frequency signals may be electrically connected to the light emitter 15 by being respectively connected to the conductive traces 171 on the insulating plates 17. The first pin 121a is electrically connected to the light transmitter 15 through a conductive trace 171 adjacent to the first pin 121a on one insulating plate 17, one group of wires 18, and the first functional sub-portion 1521. The second pin 121b is electrically connected to the light emitter 15 through a conductive trace 171 adjacent to the second pin 121b on the other insulating plate 17, another group of metal wires 18, and the second functional sub-portion 1522. Since the conductive traces 171 and the functional sub-portions connected thereto are disposed adjacent to each other, the metal wires 18 for connecting the conductive traces 171 to the functional sub-portions are very short. In this case, because a situation in which long metal wires are used to directly connect the pins 121 to the light emitter 15 is effectively avoided, a probability of coupling between the high-frequency signals and other adjacent components may be reduced, and a transmission quality of the high-frequency signals may be improved.

A group of metal wires 18 may be used to connect each conductive trace 171 to a corresponding functional sub-portion (the first functional sub-portion 1521 or the second functional sub-portion 1522) through the gold wire bonding process.

In some embodiments of the present disclosure, the light emitter 15 may be a distributed feedback (DFB) laser. The light emitter 15 includes a P-N junction between the P-electrode and the N-electrode.

One of the P-electrode and the N-electrode of the light emitter 15 is in direct contact with the first functional sub-portion 1521, and thereby is electrically connected to the first functional sub-portion 1521. The other of the P-electrode and the N-electrode of the light emitter 15 is electrically connected to the second functional sub-portion 1522 through a group of metal wires 18.

In a case where a current injected into the P-N junction of the light emitter 15 reaches a threshold current, the P-N junction generates a laser beam.

In some embodiments of the present disclosure, as shown in FIG. 10, the light emitter 15 may be attached to the first functional sub-portion 1521 through the conductive silver adhesive or eutectic solder, and is proximate to an upper side of the substrate 151 (i.e., proximate to the substrate side surface 1515). Here, word "upper" in the term "upper side" refers to a direction pointing from the first base surface 112 to the second base surface 111 as reference.

In some embodiments of the present disclosure, as shown in FIG. 10, the light emitter 15 includes a light-emitting strip 1551 at a middle position. An axis of the light-emitting strip 1551 almost coincides with the central axis 19 of the base body 11. For example, a central axis of the light-emitting strip 1551 extending in the vertical direction may be aligned with the central axis 19, and may be collinear with the central axis 19.

In some embodiments of the present disclosure, as shown in FIG. 10, the optical sub-module 10 further includes a temperature sensor 157 disposed on the second functional portion 153.

For example, the temperature sensor 157 includes a thermistor. The temperature sensor 157 may be attached to a surface of the second functional portion 153 facing the central axis 19 of the base body 11 (i.e., the second conductive layer surface 15122) through the conductive silver adhesive or the eutectic solder. The temperature sensor 157 is electrically connected to a corresponding pin 12 through a conductive wire.

In some embodiments of the present disclosure, as shown in FIG. 10, the optical sub-module 10 further includes a photodetector 156 disposed on the second functional portion 153. For example, the photodetector 156 is a monitor photoelectric detector. The photodetector 156 may be attached to the surface of the second functional portion 153 facing the central axis 19 of the base body 11 (i.e., the second conductive layer surface 15122) through the conductive silver adhesive or the eutectic solder. The photodetector 156 is electrically connected to a corresponding pin 12 through a conductive wire.

In some embodiments of the present disclosure, as shown in FIG. 10, the optical sub-module 10 further includes a heater 1541 disposed on the third functional portion 154.

The heater 1541 may be attached to a surface of the third functional portion 154 facing the central axis 19 of the base body 11 (i.e., the second conductive layer surface 15122)

through, for example, the conductive silver adhesive or the eutectic solder. The heater 1541 is configured to compensate for and supplement any insufficient heating capacity of the temperature regulator 14.

The heater 1541 includes a tantalum nitride (TaN) thin-film resistor, a chip resistor (such as a wire bondable chip resistor), or any other resistor. The heater 1541 is electrically connected to a corresponding pin 12 through a conductive wire.

In some embodiments of the present disclosure, the second functional portion 153 is more proximate to the top face 112 than the third functional portion 154.

It will be understood that the third functional portion 154 may not be provided with the heater 1541. That is, the third functional portion 154 may be an empty bonding pad.

It will be understood that, the second functional portion 153 may not be provided with the temperature sensor 157.

It will be understood that, the above manner of dividing the conductive layer into a plurality of functional portions is only an example. In the embodiments of the present disclosure, the conductive layer may be divided into four or more functional portions, and different functional portions are configured to be provided with different functional devices.

It will be understood that, in a case where the light emitter 15 is directly disposed on the second heat exchange surface 142 of the temperature regulator 14, a plurality of functional portions for providing different functional devices may also be formed on (e.g., directly on) the second heat exchange surface 142 of the temperature regulator 14.

In some embodiments of the present disclosure, the metal wires and the conductive wires may be gold wires.

Figure 2:
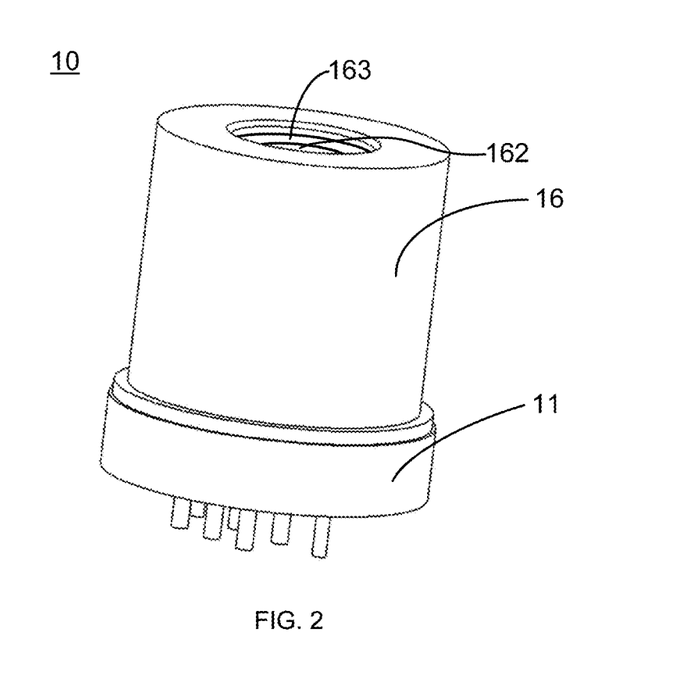
FIG. 2 is a schematic diagram showing an overall structure of an optical sub-module, in accordance with some embodiments of the present disclosure.

In some embodiments of the present disclosure, as shown in FIGS. 2 and 3, the optical sub-module 10 further includes a casing cap assembly. The casing cap assembly includes a casing cap body 16. The casing cap body 16 is disposed on the base body 11. The heat sink 13, the temperature regulator 14 and the light emitter 15 are disposed in a chamber enclosed by the casing cap body 16 and the base body 11.

The casing cap assembly further includes a lens 162, a fixing member 163 for supporting the lens, and an opening 161 disposed on a surface of the casing cap body 16 away from the top face 112. The lens 162 is disposed at the opening 161 to seal the opening 161.

With continued reference to FIG. 3, an orthographic projection of the light emitter 15 on the top face 112 is within a boundary of an orthographic projection of the lens 162 on the top face 112. Therefore, light emitted by the light emitter 15 may be transmitted to an outside of the optical sub-module 10 through the lens 162.

For example, the light emitted by the light emitter 15 is perpendicular to the surface of the base body 11 (for example, the top face 112 or the bottom face 111), and is transmitted to the outside of the optical sub-module 10 after passing through the lens 162 on the casing cap body 16. That is, a propagation direction of the light emitted by the light emitter 15 is not changed when the light emitted by the light emitter 15 passes through the lens 162.

The fixing member 163 is used for supporting the lens 162 and fixing the lens 162 at the opening 161. For example, the fixing member is a metal member for supporting the lens 162.

In some embodiments of the present disclosure, a casing for insertion of a socket of an external optical fiber patch cord may be mounted outside the casing cap body 16, such as on an external surface of the casing cap body 16, so that the light emitted by the light emitter 15 may be coupled to a core of the external optical fiber patch cord.

In some embodiments of the present disclosure, a process of mounting the components of the optical sub-module 10 may be as follows.

As shown in FIG. 6, in a case where the heat sink 13 and the base body 11 are of an integrated structure, the heat sink 13 and base body 11 may be integrally formed by means of a die or machining, and the groove 131 of the heat sink 13 may extend in a direction perpendicular to (or approximately perpendicular to) the base body 11.

The two insulating plates 17 may be attached to the respective end faces of the side arms 133a and 133b of the heat sink 13 by means of eutectic soldering or in other similar manners.

After the insulating plates 17 are mounted, the temperature regulator 14 is mounted. The temperature regulator 14 is inserted into the groove 131 of the heat sink 13, such that the first heat exchange surface 141 of the temperature regulator 14 is attached to the inner wall (i.e., the bottom wall 1321 of the groove 131) of the groove 131 of the heat sink 13, the second heat exchange surface 142 of the temperature regulator 14 faces the plurality of pins 12, and an upper side of the temperature regulator 14 (i.e., a side of the temperature regulator 14 facing away from the top face 112 of the base body 11) and the top face of the heat sink body 132 of the heat sink 13 (i.e., a face of the heat sink body 132 facing away from the top face 112) are in a same plane (i.e., coplanar).

After the temperature regulator 14 is mounted, the substrate 151 is attached to the second heat exchange surface 142 of the temperature regulator 14, such that the upper side of the substrate 151 (i.e., the substrate side surface 1515) and the surface of the heat sink body 132 of the heat sink 13 facing away from the top face 112 are in a same plane (i.e., coplanar), and the second body surface 1514 of the substrate 151 and the surfaces of the insulating plates 17 facing the plurality of pins 12 are in a same plane (i.e., coplanar).

After the substrate 151 is mounted, the functional devices such as the light emitter 15, the photodetector 156 and the temperature sensor 157 are mounted thereon.

Here, an accuracy of a mounting position of the light emitter 15 directly affects a coupling efficiency of the external optical fiber patch cord. Therefore, in order to ensure the accuracy of the mounting position of the light emitter 15, in a process of mounting the light emitter 15, taking the side arms 133a and 133b on both sides of the heat sink 13 as reference, a position of the light emitter 15 is adjusted, such that the light-emitting strip 1551 of the light emitter 15 is coincident with the central axis 19 of the base body 11. That is, a position of the light emitter 15 in an X-axis direction is adjusted. Taking the upper surface of the heat sink 13 as a reference surface, a distance between the light emitter 15 and the top face 112 of the base body 11 is adjusted. That is, a position of the light emitter 15 in a Z-axis direction is adjusted, such that the distance between the light emitter 15 and the top face 112 of the base body 11 satisfies a distance providing adequate optical coupling of the external optical fiber patch cord.

In the case where the heat sink 13 and the base body 11 are formed as an integrated structure, since a position of the heat sink 13 relative to the base body 11 has been determined, and a structural design of the groove 131 of the heat sink 13 has been determined, the position of the light emitter 15 in the Y-axis direction is determined. That is, a distance between the light emitter 15 and a plane where the central axis 19 of the base body 11 is in is determined. Therefore, in a process of mounting the light emitter 15 on the substrate 151, the position of the light emitter 15 may be determined simply just by adjusting the position of the light emitter 15 in the Z-axis direction and the position of the light emitter 15 in the X-axis direction.

It will be noted that, the Z-axis direction is a direction perpendicular to the bottom face 111 of the base body 11 and pointing from the bottom face 111 towards the top face 112. The X-axis direction is a direction pointing from one side arm 133a of the heat sink 13 to the other side arm 133b of the heat sink 13. The Y-axis direction is a direction perpendicular to a plane composed of the X-axis and the Z-axis.

The above mounting manner not only reduces a difficulty of determining the position of the light emitter 15 and improves production efficiency, but also reduces a production cost and improves a product yield. Compared with a solution in which positions in three directions of the light emitter 15 need to be adjusted in the TO packaging, in the embodiments of the present disclosure, the difficulty of determining the position of the light emitter 15 in a process of manufacturing an optical sub-module may be effectively reduced.

Since the heat sink 13 in the embodiments of the present disclosure includes the groove 131, by directly embedding the temperature regulator 14 into the groove 131 of the heat sink 13, a position of the temperature regulator 14 relative to the heat sink 13 does not need to be greatly adjusted in the process of manufacturing the optical sub-module, a difficulty of mounting the temperature regulator 14 is reduced, and a positioning accuracy is high and improved.

In addition, a light emitter having a high transmission rate, such as a light emitter having a transmission rate of 25 Gbit/s, or even a light emitter having a transmission rate of up to 50 Gbit/s, is suitable for the optical sub-module in the embodiments of the present disclosure.

Figure 11:
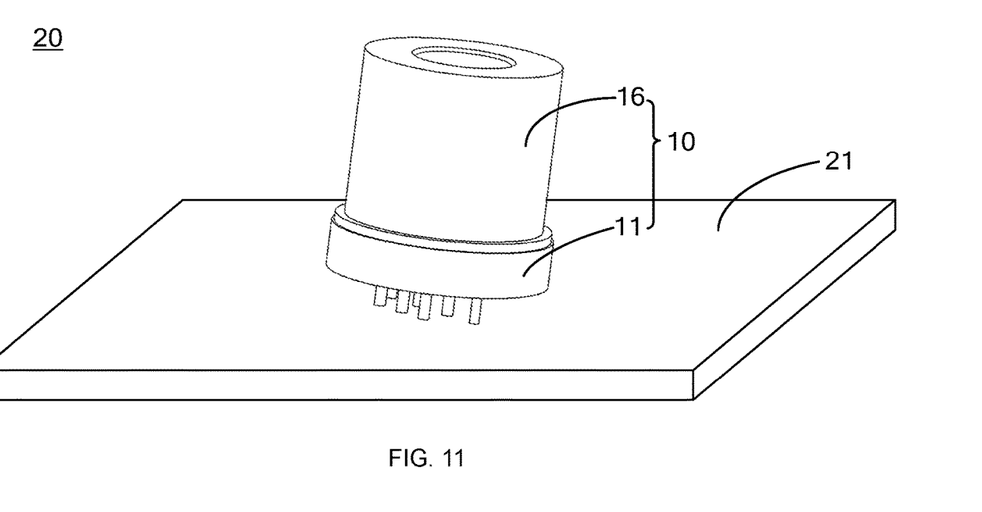
FIG. 11 is a schematic diagram showing a structure of an optical module, in accordance with some embodiments of the present disclosure.

The embodiments of the present disclosure further provide an optical module. As shown in FIG. 11, the optical module 20 includes a circuit board 21 and at least one optical sub-module 10, as described above, disposed on the circuit board 21.

For example, the circuit board 21 is a printed circuit board (PCB).

The above descriptions are merely preferred embodiments of the present disclosure and are not intended to limit the present disclosure. Any modification, equivalent replacement, or improvement made within the spirit and principles of the present disclosure shall be included in the protection scope of the present disclosure.

What is claimed is:

1. An optical sub-module, comprising:
a base body comprising a first base surface and a second base surface that are opposite to each other;
a plurality of pins each penetrating through the second base surface and the first base surface;
a heat sink disposed on the first base surface, wherein the heat sink comprises a groove facing the plurality of pins, a heat sink body and two side arms extending from a same side of the heat sink body, and the heat sink body forms a bottom wall of the groove, and the two side arms form respective side walls of the groove;
a temperature regulator disposed in the groove, and configured to perform a temperature regulating to a light emitter, wherein the temperature regulator comprises a first heat exchange surface and a second heat exchange surface that are opposite to each other, the first heat exchange surface is in contact with an inner wall of the groove, and a distance between the first heat exchange surface and the second heat exchange surface is equal to the depth of the groove of the heat sink;
the light emitter disposed at the second heat exchange surface, and configured to perform heat transfer with the temperature regulator;
an insulating plate disposed on an end face of each side arm;
a conductive trace disposed on a surface of each insulating plate facing the plurality of pins, wherein a conductive trace corresponding to an end face of a first side arm is configured to be electrically connected to the light emitter, and a conductive trace corresponding to an end face of a second side arm of the two side arms is configured to be electrically connected to the light emitter; and
a substrate disposed on the second heat exchange surface, wherein the substrate is positioned above the groove, and the light emitter is disposed on the substrate, wherein
the substrate comprises a substrate body and a conductive layer disposed on the substrate body; the substrate body comprises a first body surface and a second body surface that are opposite to each other, and the conductive layer further comprises a first conductive layer surface and a second conductive layer surface that are opposite to each other; the first body surface is in contact with the second heat exchange surface; and the first conductive layer surface is in contact with the second body surface, and the second conductive layer surface is in contact with the light emitter;
the conductive layer further comprises a plurality of functional portions that are insulated from each other, the plurality of functional portions comprises a first functional portion and a second functional portion;
the first functional portion comprises a first functional sub-portion and a second functional sub-portion; the first functional sub-portion is in contact with one of a P-electrode and an N-electrode of the light emitter disposed thereon, the second functional sub-portion is electrically connected to the other of the P-electrode and the N-electrode of the light emitter; the light emitter is electrically connected to the conductive trace corresponding to the end face of the first side arm through the first functional sub-portion and is electrically connected to the conductive trace corresponding to the end face of the second side arm through the second functional sub-portion; and
the optical sub-module further comprises a photodetector disposed on the second functional portion, and the photodetector is electrically connected to a corresponding pin through a conductive wire.

2. The optical sub-module according to claim 1, wherein the plurality of pins comprise a first pin and a second pin;
the conductive trace corresponding to the end face of the first side arm is configured to be electrically connected to the first pin; and
the conductive trace corresponding to the end face of the second side arm is configured to be electrically connected to the second pin.

3. The optical sub-module according to claim 2, further comprising a plurality of groups of metal wires,
wherein the first functional sub-portion is disposed adjacent to the conductive trace corresponding to the end face of the first side arm, and the first functional sub-portion is electrically connected to the conductive trace corresponding to the end face of the first side arm through a corresponding one of the plurality of groups of metal wires; and the second functional sub-portion is electrically connected to the other of the P-electrode and the N-electrode of the light emitter through a corresponding one of the plurality of groups of metal wires, the second functional sub-portion is disposed adjacent to the conductive trace corresponding to the end face of the second side arm, and the second functional sub-portion is electrically connected to the conductive trace corresponding to the end face of the second side arm through a corresponding one of the plurality of groups of metal wires.

4. The optical sub-module according to claim 3, wherein the optical sub-module further comprises a temperature sensor disposed on the second functional portion.

5. The optical sub-module according to claim 4, wherein the plurality of functional portions further comprises a third functional portion, and the optical sub-module further comprises a heater disposed on the third functional portion.

6. The optical sub-module according to claim 5, wherein the second functional portion is closer to the first base surface than the third functional portion.

7. The optical sub-module according to claim 2, wherein the second body surface is closer to a central axis of the base body than the first body surface, and the central axis penetrates a center of the first base surface and a center of the second base surface.

8. The optical sub-module according to claim 2, wherein the second body surface and the surface of each insulating plate on which the corresponding conductive trace is disposed are coplanar; and
    the substrate body further comprises a substrate side surface connecting the first body surface and the second body surface and facing away from the first base surface, and the substrate side surface and one surface of the heat sink body facing away from the first base surface are coplanar.

9. The optical sub-module according to claim 2, wherein patterns of the conductive traces on the insulating plates on the two side arms of the heat sink are mirror-symmetrical.

10. The optical sub-module according to claim 1, wherein the temperature regulator further comprises a first electrode and a second electrode, the plurality of pins comprise a third pin and a fourth pin, and the first electrode and the second electrode are electrically connected to the third pin and the fourth pin, respectively.

11. The optical sub-module according to claim 10, wherein the first electrode and the second electrode are disposed at a side of the first heat exchange surface facing the plurality of pins.

12. The optical sub-module according to claim 1, wherein the heat sink and the base body are integrated with each other.

13. The optical sub-module according to claim 1, further comprising a casing cap assembly, wherein the casing cap assembly comprises a casing cap body, the casing cap body is disposed on the base body, and the heat sink, the temperature regulator, and the light emitter are disposed in a chamber enclosed by the casing cap assembly and the base body.

14. The optical sub-module according to claim 13, wherein the casing cap assembly further comprises a lens and a fixing member supporting the lens, and the lens is configured to transmit light emitted by the light emitter to an outside of the optical sub-module.

15. The optical sub-module according to claim 14, wherein the casing cap assembly further comprises an opening disposed on a surface of the casing cap body away from the first base surface, and the lens is disposed in the opening; and
    an orthographic projection of the light emitter on the first base surface is within a boundary of an orthographic projection of the lens on the first base surface.

16. The optical sub-module according to claim 14, wherein the fixing member comprises a metal member.

17. The optical sub-module according to claim 1, wherein the temperature regulator further comprises a plurality of semiconductor structures, and the plurality of semiconductor structures comprise at least one N-type semiconductor structure and at least one P-type semiconductor structure.

18. An optical module, comprising:
a circuit board; and
    at least one optical sub-module according to claim 1 disposed on the circuit board.

* * * * *